(12) United States Patent
Wang et al.

(10) Patent No.: US 6,566,248 B1
(45) Date of Patent: May 20, 2003

(54) GRAPHOEPITAXIAL CONDUCTOR CORES IN INTEGRATED CIRCUIT INTERCONNECTS

(75) Inventors: Pin-Chin Connie Wang, Menlo Park, CA (US); Minh Quoc Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 100 days.

(21) Appl. No.: 09/759,114

(22) Filed: Jan. 11, 2001

(51) Int. Cl.[7] .................. H01L 21/4763; H01L 21/44
(52) U.S. Cl. ................. 438/629; 438/637; 438/672
(58) Field of Search ............................. 438/629, 637, 438/672

(56) References Cited

U.S. PATENT DOCUMENTS

| | | | |
|---|---|---|---|
| 6,348,731 B1 | * | 2/2002 | Ashley et al. ............... 257/751 |
| 2002/0000271 A1 | * | 1/2002 | Ritzford et al. ............. 148/518 |
| 2002/0050628 A1 | * | 5/2002 | Krishnamoorthy et al. . 257/586 |

FOREIGN PATENT DOCUMENTS

| | | | | |
|---|---|---|---|---|
| JP | 1-248643 | * | 10/1989 | ........... H01L/21/88 |
| JP | 7-29907 | * | 1/1995 | ....... H01L/21/3205 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 242–246.*

* cited by examiner

Primary Examiner—Olik Chaudhuri
Assistant Examiner—William M. Brewster
(74) Attorney, Agent, or Firm—Mikio Ishimaru

(57) ABSTRACT

A manufacturing method is provided for an integrated circuit having a semiconductor substrate with a semiconductor device. A device dielectric layer is formed on the semiconductor substrate. A channel dielectric layer on the device dielectric layer has an opening formed therein. A barrier layer lines the channel opening. A conductor core with a random grain texture fills the opening over the barrier layer. The crystallographic orientation of the conductor core is then graphoepitaxially changed to reduce its random grain texture.

20 Claims, 2 Drawing Sheets

GRAPHOEPITAXIAL CONDUCTOR CORES IN INTEGRATED CIRCUIT INTERCONNECTS

TECHNICAL FIELD

The present invention relates generally to semiconductor technology and more specifically to depositing conductor cores in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metalization" and is performed using a number of different photolithographic, deposition, and removal techniques.

Briefly, individual semiconductor devices are formed in and on a semiconductor substrate and a device dielectric layer is deposited. Various techniques are used to form gate and source/drain contacts, which extend up to the surface of the device dielectric layer. In a process called the "damascene" technique, dielectric layers are deposited over the device dielectric layers and openings are formed in the dielectric layers. Conductor materials are deposited on the dielectric layers and in the openings. A process is used to planarize the conductor materials with the surface of the dielectric layers so as to cause the conductor materials to be "inlaid" in the dielectric layers.

More specifically for a single layer of interconnections, a "single damascene" technique is used in which the first channel formation of the single damascene process starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide fair barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit. However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

For more complex integrated circuits, a "dual damascene" technique is used in which channels of conductor materials are separated by interlayer dielectric layers in vertically separated planes and interconnected by vertical connections, or "vias".

More specifically, the dual damascene process starts with the deposition of a thin etch stop layer, or the via stop layer, over the first channels and the first channel dielectric layer. A via dielectric layer is deposited on the via stop layer. Again, where the via dielectric layer is of an oxide material, such as silicon oxide, the via stop layer is a nitride, such as silicon nitride, so the two layers can be selectively etched.

Second channel stop and second channel dielectric layers are formed on the via dielectric layer. Again, where the second channel dielectric layer is of an oxide material, such as silicon oxide, the second channel stop layer is a nitride, such as silicon nitride, so the two layers can be selectively etched. The second channel and via stop layers and second channel and via dielectric layers are then subject to further photolithographic process, etching, and photoresist removal steps to form via and second channel openings in the pattern of the second channels and the vias.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The capping layer may be an etch stop layer and may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metalization process. The elimination of metal etch steps is important as the semiconductor industry moves from aluminum (Al) to other metalization materials, such as copper, which are very difficult to etch.

One problem with channel and via conductor materials is that they have a random grain texture. This random grain texture increases the resistance of the conductor material over non-randomized grain texture and also increases conductor material diffusion and thus reduces electro-migration lifetime. Thus, there has been a problem with being able to produce a non-random grain texture conductor material.

A solution to this problem has been long sought but has long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric layer. A barrier layer is deposited to line the opening and a conductor core with random grain texture is deposited to fill the channel opening over the barrier layer. The crystallographic orientation of the conductor core is then graphoepitaxially changed to reduce its random grain texture. The non-random texture of the conductor core reduces the resistance of the conductor material and also reduces diffusion, thus increasing electro-migration lifetime.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
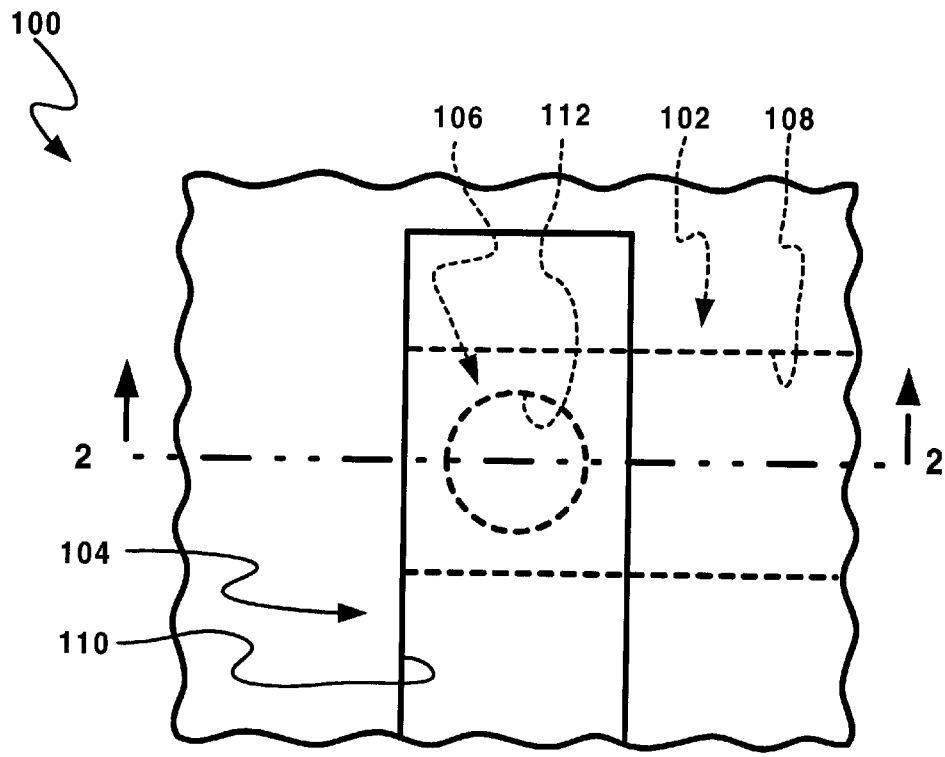
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
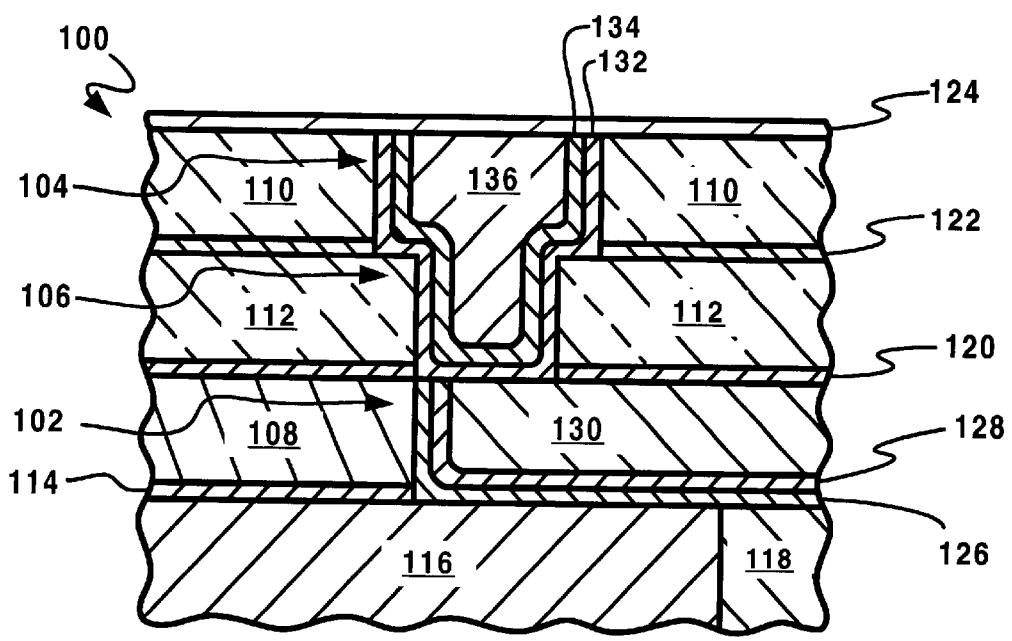
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor materials of the conductor cores 130 and 136 are deposited. The seed layers 128 and 134 are of substantially the same conductor material as the conductor cores 130 and 136 and become part of the respective conductor cores 130 and 136 after the deposition.

In the past, for copper conductor material and seed layers, highly resistive diffusion barrier materials such as tantalum nitride (TaN), titanium nitride (TiN), or tungsten nitride (WN) were used as barrier materials to prevent diffusion. In addition to increasing the overall resistance of the semiconductor chip which contained all the semiconductor devices, the barrier region 138 would block diffusion of copper from the conductor core 130 to the conductor core 136 as electromigration caused the movement of copper atoms out of the via 106 and allowed the formation of voids therein.

In the past, the conductor cores 130 and 136 were subject to anneals after deposition but before chemical-mechanical polishing (CMP). Before CMP, there was a relatively thick layer of a conductor core material above the respective barrier layers 126 and 132. These thick layers would dominate the grain growth in the first and second conductor cores 130 and 136 and result in random grain texture therein.

Figure 3:
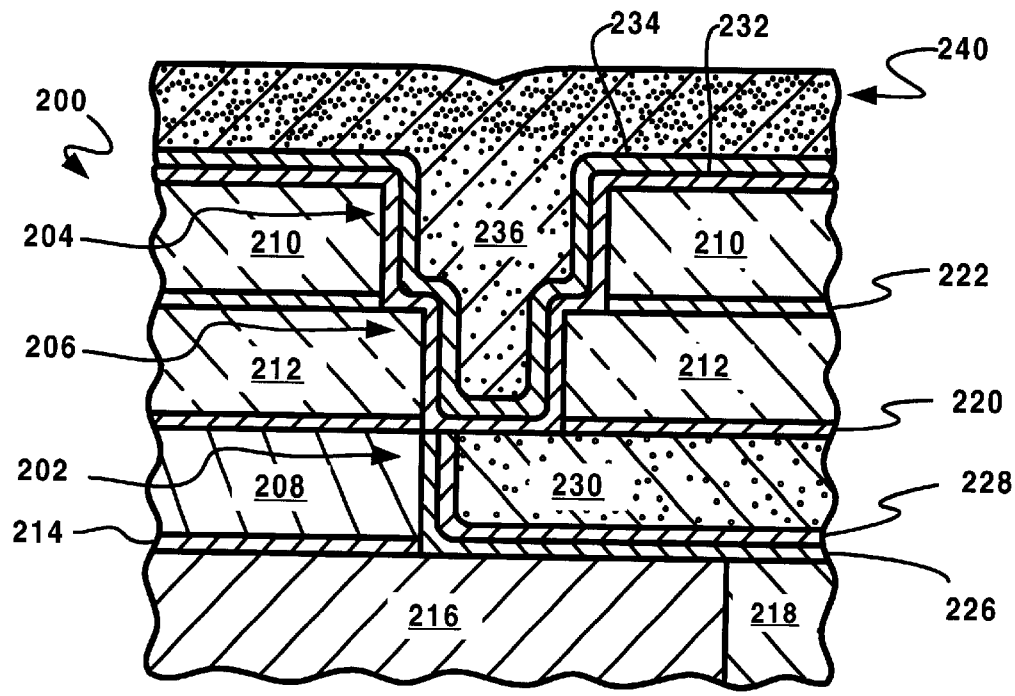
FIG. 3 is a cross-section, similar to FIG. 2 (PRIOR ART), showing one embodiment of the use of graphoepitaxy according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, and the second channel dielectric layer 210.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor materials of the conductor cores 230 and 236 are deposited. The seed layers 228 and 234 are of substantially the same conductor material of the conductor cores 230 and 236 and become part of the respective conductor cores 230 and 236 after the deposition.

In one embodiment of the present invention, the conductor core 236 is shown after deposition and annealing but before CMP, which is used to planarize the conductor core 236 and the seed layer 234 to be co-planar of the top surface of the barrier layer 232. The conductor core 236 contains impurities 240.

The impurities 240 can be various organic impurities such as carbon (C), sulfur (S), chlorine (Cl), hydrogen (H), and oxygen (O) or various inorganic impurities such as tin (Sn), zinc (Zn), nickel (Ni), calcium (Ca), indium (In), zirconium (Zr), etc. Among the inorganic impurities, zirconium is one of the most effective since it has very low diffusively in copper and so will not diffuse into the feature during grain growth anneal. The impurities 240 are deposited during the plating or other deposition of the conductor cores 230 and 236.

During anneal, the impurities 240 will both retard the grain growth and increase the "graphoepitaxy" effect which tends to align the grains to the "edges" of the channel or via in a non-randomized grain texture.

"Graphoepitaxy" is a technique by which the crystallographic orientation of a film deposited on a surface can be controlled. The term "graphoepitaxy" is derived from the Greek ("grapho" meaning to write or incise) and was chosen to convey the concept of the principle of using an artificially created surface pattern to induce epitaxy. In the present invention, graphoepitaxy eliminates edge energy by aligning crystallographic orientation of copper grains to the edges of the channels. Thus, the impurities 240 under anneal act to create graphoepitaxial growth, which will be of relatively large grains with a uniform, non-random grain texture. Basically, the conductor cores 230 and 236 will have their grain alignment controlled by the surface relief of the channels and not by the crystal structure thereof.

In the present invention, a bi-layer deposition is performed using different plating conditions (changes in the impurity concentration in the plating bath) or methods (changes through electrochemical, chemical vapor, and physical vapor deposition processes) so as to provide a differential impurity concentration between the channel and the volume above the channel. The channel will have a low impurity concentration of below 1E18 atoms per cubic centimeter (a/cc) while the conductor material above the channel will have a concentration between 1E19 to 1E21 a/cc.

For copper conductor channels, after the channels are filled, a low temperature anneal is performed below 100° C. for at least two hours and preferably several hours. This temperature does not distribute the impurities from the top of the channel to the bottom but does cause grain growth. Too high an anneal temperature at this point will result in random grain orientation, but with the specified anneal, the grain growth will be slow and will enhance graphoepitaxy effect.

After the graphoepitaxy anneal, the conductor material is subject to chemical mechanical polishing (CMP) to planarize the conductor material with the barrier layer to form the channels. Once the conductor material has been subject to the CMP, the high impurity conductor material has been removed so a higher temperature anneal may be performed to fully stabilize the texture which was produced during the graphoepitaxy anneal. The stabilization anneal is performed from 200° C. to 400° C. from 30 seconds to 60 minutes.

Figure 4:
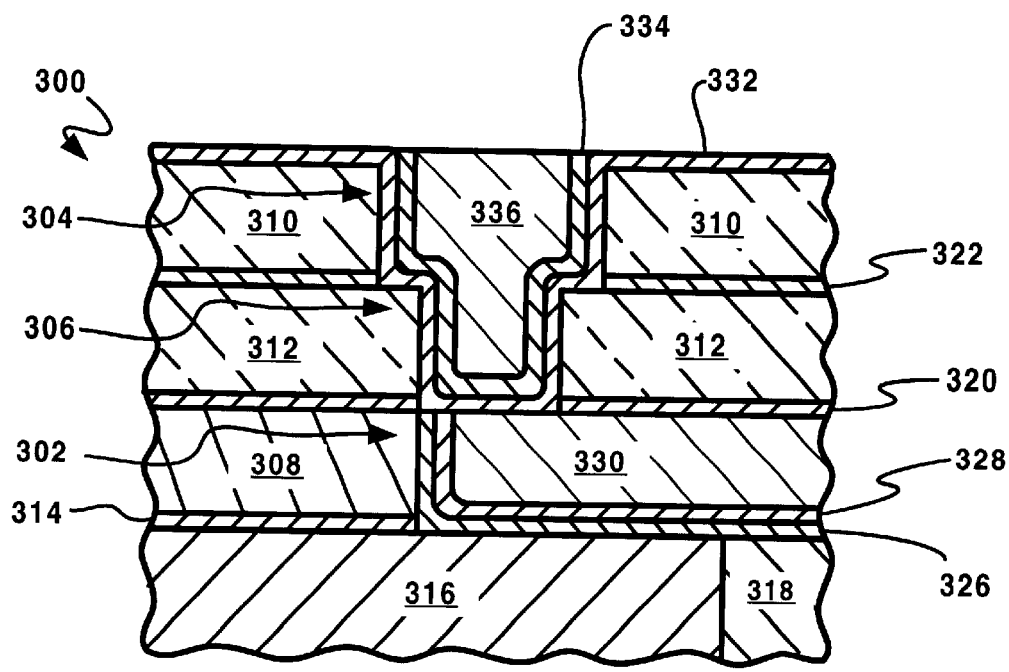
FIG. 4 is a cross-section, similar to FIG. 2 (PRIOR ART), showing an alternate embodiment of the use of graphoepitaxy according to the present invention.

Referring now to FIG. 4, therein is shown a cross-section similar to that shown in FIG. 2 (PRIOR ART) of a semiconductor wafer 300 of the present invention. The semiconductor wafer 300 has first and second channels 302 and 304 connected by a via 306. The first and second channels 302 and 304 are respectively disposed in first and second dielectric layers 308 and 310. The via 306 is a part of the second channel 304 and is disposed in a via dielectric layer 312.

A portion of the first channel 302 is disposed in a first channel stop layer 314 and is on a device dielectric layer 316. Generally, metal contacts (not shown) are formed in the device dielectric layer 316 to connect to an operative semiconductor device (not shown). This is represented by the contact of the first channel 302 with a semiconductor device gate 318 embedded in the device dielectric layer 316. The various layers above the device dielectric layer 316 are sequentially: the first channel stop layer 314, the first channel dielectric layer 308, a via stop layer 320, the via dielectric layer 312, a second channel stop layer 322, and the second channel dielectric layer 310.

The first channel 302 includes a barrier layer 326 and a seed layer 328 around a conductor core 330. The second channel 304 and the via 306 include a barrier layer 332 and a seed layer 334 around a conductor core 336. The barrier layers 326 and 332 are used to prevent diffusion of the conductor materials into the adjacent areas of the semiconductor device. The seed layers 328 and 334 form electrodes on which the conductor materials of the conductor cores 330 and 336 are deposited. The seed layers 328 and 334 are of substantially the same conductor material of the conductor cores 330 and 336 and become part of the respective conductor cores 330 and 336 after the deposition.

In this embodiment, it has been discovered that, by performing the conductor core or barrier layer CMP prior to anneal, rather than after the anneal, it is possible to achieve the graphoepitaxial crystallographic alignment in the conductor cores 330 and 336.

In FIG. 4, the semiconductor wafer 300 is shown with the conductor core 336 after conductor core CMP. The to surface of the conductor core 336 is co-planar with the top surface of the barrier layer 332. After the CMP, the semiconductor wafer 300 is annealed and all the beneficial results described above achieved.

Thus, with the present invention, the grain textures are non-randomized so as to reduce the overall resistance of the conductor cores and also reduce the conductor material diffusion so as to increase the electro-migration lifetimes.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$), silicon oxynitride (SiON) or low dielectric constant materials such as silicon carbide (SiC) with dielectric constants below 5.5.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:
   providing a semiconductor substrate having a semiconductor device provided thereon;
   forming a dielectric layer on the semiconductor substrate;
   forming an opening in the dielectric layer;
   depositing a barrier layer to line the opening;
   depositing a conductor core over the barrier layer to fill the opening and connect to the semiconductor device, the conductor core having a random grain texture; and
   graphoepitaxially changing the crystallographic orientation of the conductor core to reduce randomness of the grain texture thereof over the random grain texture of the conductor core as deposited.

2. The method of manufacturing an integrated circuit as claimed in claim 1 wherein graphoepitaxially changing the crystallographic orientation includes a graphoepitaxy anneal and a chemical-mechanical polishing of the conductor core to be co-planar with the barrier layer.

3. The method of manufacturing an integrated circuit as claimed in claim 1 wherein graphoepitaxially changing the crystallographic orientation includes a graphoepitaxy anneal, a chemical-mechanical polishing of the conductor core to be co-planar with the barrier layer, and a stabilization anneal after chemical-mechanical polishing.

4. The method of manufacturing an integrated circuit as claimed in claim 1 wherein graphoepitaxially changing the crystallographic orientation includes depositing impurities in the conductor core while depositing the conductor core and graphoepitaxy annealing the conductor core after depositing the conductor core.

5. The method of manufacturing an integrated circuit as claimed in claim 1 wherein graphoepitaxially changing the crystallographic orientation includes depositing impurities with differential impurity concentrations while depositing the conductor core.

6. The method of manufacturing an integrated circuit as claimed in claim 1 wherein graphoepitaxially changing the crystallographic orientation includes depositing organic impurities while depositing the conductor core and includes annealing the conductor core after depositing the conductor core.

7. The method of manufacturing an integrated circuit as claimed in claim 1 wherein graphoepitaxially changing the crystallographic orientation includes depositing inorganic impurities while depositing the conductor core and includes annealing the conductor core after depositing the conductor core.

8. The method of manufacturing an integrated circuit as claimed in claim 1 wherein graphoepitaxially changing the crystallographic orientation includes depositing the conductor core in two different processes.

9. The method of manufacturing an integrated circuit as claimed in claim 1 depositing the barrier layer uses a material selected from a group consisting of tantalum, titanium, tungsten, a compound thereof, and a combination thereof.

10. The method of manufacturing an integrated circuit as claimed in claim 1 wherein depositing the conductor core deposits a material selected from a group consisting of copper, aluminum, gold, silver, a compound thereof, and a combination thereof.

11. A method of manufacturing an integrated circuit comprising:
    providing a semiconductor substrate having a semiconductor device provided thereon;
    forming a device dielectric layer on the semiconductor substrate;
    forming a channel layer on the device dielectric layer;
    forming a channel opening in the channel dielectric layer;
    depositing a barrier layer to line the channel opening;
    depositing a seed layer on the barrier layer; and
    depositing a conductor core to fill the channel opening and connect to the semiconductor device, the conductor core having a random grain texture; and
    graphoepitaxially changing the crystallographic orientation of the conductor core to reduce randomness of the grain texture thereof over the random grain texture of the conductor core as deposited.

12. The method of manufacturing an integrated circuit as claimed in claim 11 wherein graphoepitaxially changing the crystallographic orientation includes a graphoepitaxy anneal performed below 100° C. for more than three hours and a chemical-mechanical polishing of the conductor core and the seed layer of the conductor core to be co-planar with the barrier layer.

13. The method of manufacturing an integrated circuit as claimed in claim 11 wherein graphoepitaxially changing the crystallographic orientation includes a graphoepitaxy anneal performed below 100° C. for more than two hours, a chemical-mechanical polishing of the conductor core and the seed layer of the conductor core to be co-planar with the barrier layer, and a stabilization anneal performed from 200° C. to 400° C. from 30 seconds to 60 minutes.

14. The method of manufacturing an integrated circuit as claimed in claim 11 wherein graphoepitaxially changing the crystallographic orientation includes depositing impurities in the conductor core in a concentration under 1E18 atoms per cubic centimeter while depositing the conductor core followed by annealing the conductor core.

15. The method of manufacturing an integrated circuit as claimed in claim 11 wherein graphoepitaxially changing the crystallographic orientation includes depositing impurities in the conductor core in the channel in a concentration under 1E18 atoms per cubic centimeter while depositing the conductor core above the channel in a concentration from 1E19 to 1E21 atoms per cubic centimeter.

16. The method of manufacturing an integrated circuit as claimed in claim 11 wherein graphoepitaxially changing the crystallographic orientation includes depositing organic impurities selected from a group consisting of carbon, sulfur, chlorine, hydrogen, oxygen, a compound thereof, and a combination thereof, while depositing the conductor core and includes annealing the conductor core after depositing the conductor core.

17. The method of manufacturing an integrated circuit as claimed in claim 11 wherein graphoepitaxially changing the crystallographic orientation includes depositing inorganic impurities selected from a group consisting of tin, zinc, nickel, calcium, indium, zirconium, a compound thereof, and a combination thereof, while depositing the conductor core and includes annealing the conductor core after depositing the conductor core.

18. The method of manufacturing an integrated circuit as claimed in claim 11 wherein graphoepitaxially changing the crystallographic orientation includes depositing the conductor core in two different processes selected from a group consisting of electrochemical, chemical vapor, and physical vapor deposition processes.

19. The method of manufacturing an integrated circuit as claimed in claim 11 wherein depositing the barrier layer uses a material selected from a group consisting of tantalum, titanium, tungsten, a compound thereof, and a combination thereof.

20. The method of manufacturing an integrated circuit as claimed in claim 11 wherein depositing the seed layer and the conductor core deposits materials selected from a group consisting of copper, gold, silver, a compound thereof, and a combination thereof.

* * * * *